(12) United States Patent
Korobkov (10) Patent No.: US 6,763,509 B2
(45) Date of Patent: Jul. 13, 2004

(54) METHOD AND APPARATUS FOR ALLOCATING DECOUPLING CAPACITOR CELLS

(75) Inventor: Alexander I. Korobkov, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 35 days.

(21) Appl. No.: 10/256,580

(22) Filed: Sep. 26, 2002

(65) Prior Publication Data

US 2004/0064800 A1 Apr. 1, 2004

(51) Int. Cl.[7] .............................................. G06F 17/50
(52) U.S. Cl. ........................ 716/8; 716/7; 716/9; 716/10
(58) Field of Search ............................... 716/2, 7–10

(56) References Cited

U.S. PATENT DOCUMENTS

| | | | |
|---|---|---|---|
| 6,170,079 B1 * | 1/2001 | Kato et al. ............. | 716/10 |
| 6,323,050 B1 | 11/2001 | Dansky et al. ........... | 438/17 |
| 6,480,137 B2 * | 11/2002 | Kulkarni et al. .......... | 341/172 |
| 6,625,791 B1 * | 9/2003 | Bobba et al. ............ | 716/8 |

OTHER PUBLICATIONS

Thomas H. Cormen et al., "Introduction to Algorithms", The MIT Press, 1998, pp. 4 cover and index pgs., pp. 175–177, 301–303, 308–311.
Shiyou Zhao et al., "Decoupling Capacitance Allocation and Its Application to Power Supply Noise Aware Floorplanning", Aug. 23, 2001, pp. 1–24.

* cited by examiner

*Primary Examiner*—Matthew Smith
*Assistant Examiner*—Paul Dinh
(74) *Attorney, Agent, or Firm*—Thelen Reid & Priest, LLP; David B. Ritchie (57) ABSTRACT

A method for allocating decoupling capacitor cells in an integrated circuit (IC) design, includes (a) obtaining geometrical information of rectangular areas in the IC design, each of the rectangular areas not intersecting any design figure in selected metal layers of the IC design in a design area, (b) determining possible locations for rows of decoupling capacitor cell arrays to be placed in the rectangular areas, a row including a set of cell arrays to be placed across the rectangular areas in a direction of a first coordinate axis of the design area, (c) determining for each possible location a number of decoupling capacitor cells included in the row, and (d) selecting row locations satisfying a certain design rule from among the possible locations in a descending order of the number of the decoupling capacitor cells.

43 Claims, 10 Drawing Sheets

```
200 ─┐
     ▼
Obtain Geometrical Information of
Rectangular Areas

202 ─┐
     ▼
Determine Possible Locations of Rows of
Capacitor Cell Arrays

204 ─┐
     ▼
Determine Number of Capacitor Cells for
Each Possible Location

206 ─┐
     ▼
Select Row Locations from Possible Locations
in Descending Order of the Number of Cells
```

METHOD AND APPARATUS FOR ALLOCATING DECOUPLING CAPACITOR CELLS

FIELD OF THE INVENTION

The present invention relates to integrated circuit (IC) designs. More particularly, the present invention relates to a method and apparatus for processing physical design data of an IC design.

BACKGROUND OF THE INVENTION

Signal integrity is rapidly becoming one of the important issues in IC designs, especially in very large scale integration (VLSI) physical designs. As the chip size and performance are increasing while the process feature size is reducing, noise caused by relatively small distance between power supply lines has very strong impact on transistor behavior. Such noise may reduce performance or even introduce logic failures into the IC system. In order to reduce the power supply noise decoupling capacitance allocation is usually employed. Since a power/ground grid has a very large dimension and high density, it is almost impossible to manually allocate decoupling capacitors. Thus, automatic capacitance allocation methods have been developed so as to allocate decoupling capacitors under certain constraints required by the IC design.

The Opus database, available from Cadence Design Systems, Inc. of San Jose, Calif., is a standard format database used for the physical data storage and maintenance of various types of IC designs, such as microprocessors, memory units, and application specific integrated circuits (ASICs). The Opus data format is typically used by Opus applications (and their compatibles) which provide a layout view, manual check, and other interactive operations on the physical data. The Opus database has been widely used by design engineers to draw layout and schematic as well as provide another necessary processing. Using the Opus functionality is advantageous to perform intermediate physical design operations since all physical design data are stored inside a single database and direct access thereto is guaranteed. However, some operations such as decoupling capacitance allocation have not been provided by conventional Opus functionality.

DESCRIPTION OF THE INVENTION

A method for allocating decoupling capacitor cells in an integrated circuit (IC) design, includes (a) obtaining geometrical information of rectangular areas in the IC design, each of the rectangular areas not intersecting any design figure in selected metal layers of the IC design in a design area, (b) determining possible locations for rows of decoupling capacitor cell arrays to be placed in the rectangular areas, a row including a set of cell arrays to be placed across the rectangular areas in a direction of a first coordinate axis of the design area, (c) determining for each possible location a number of decoupling capacitor cells included in the row, and (d) selecting row locations satisfying a certain design rule from among the possible locations in a descending order of the number of the decoupling capacitor cells.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for allocating decoupling capacitor cells in an IC design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available from Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 1:
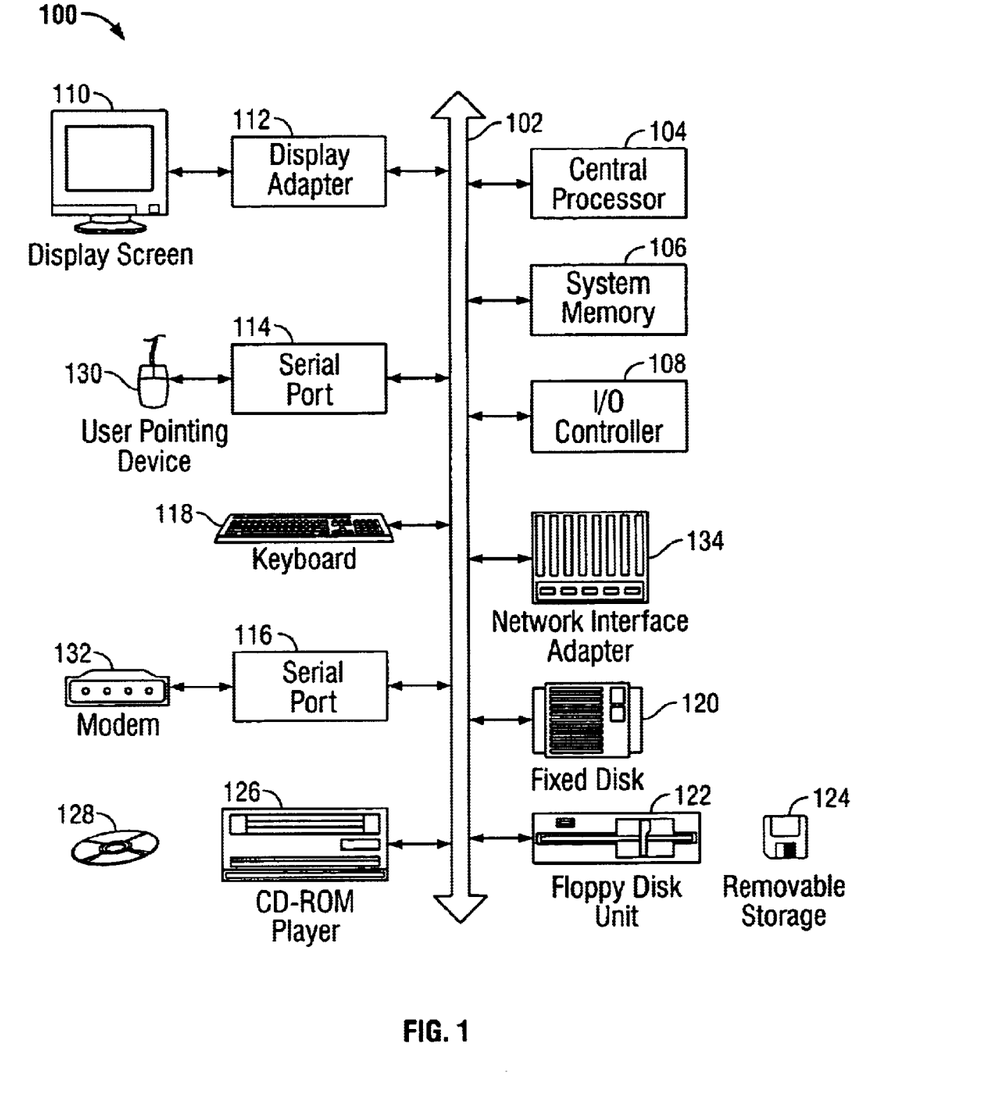
FIG. 1 is a block diagram schematically illustrating a computer system suitable for implementing aspects of the present invention.

FIG. 1 depicts a block diagram of a computer system 100 suitable for implementing aspects of the present invention. As shown in FIG. 1, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 1 to be present to practice the present invention, as discussed below. Furthermore, the devices and subsystems may be interconnected in different ways from that shown in FIG. 1. The operation of a computer system such as that shown in FIG. 1 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

In general, there are two different approaches to allocate decoupling capacitors. The difference is usually coming from the design requirements: (a) when to allocate (i.e., at which design flow phase), and (b) how to allocate. For example, the timing of capacitor allocation may be after floor planning, after global routing, after power routing, or the like. However, the present invention is applicable to any stage of the IC design flow, and does not depend on a design flow phase. With respect to "how to allocate," the capacitor placement rules may require a certain distance between decoupling capacitor metals and closest routing metals (or other metal figures), a certain distance between adjacent decoupling capacitors, a certain amount or range of a shift/overlap between those capacitor cells, and the like.

Design objects for an IC design are stored in a database, typically an Opus database, in accordance with their properties. Each design object typically includes geometrical properties (e.g., coordinates defining the location of the design object) and non-geometrical properties (e.g., layer, type of the design object, connectivity data, and the like). The object "figure" is particularly under consideration for decoupling capacitor allocation. A design figure is a geometrical representation of an element (circuit component) of the IC design, such as a cell, macrocell, circuit core, gate, transistor, wire, via and the like. Such a design object directly corresponds to a metal figure that is laid-out in an IC design area, which is to be produced on a real IC chip using photolithography and other semiconductor processes.

In order to allocate decoupling capacitors, empty spaces inside particular design area are identified using an IC design tool, such as Calibre®, available from Mentor Graphics® Corporation of Wilsonville, Oreg. An empty space, which is also referred to as a white space, is a rectangular area typically attached to a particular metal layer (or a set of metal layers), which does not intersect any figure in that metal layer(s).

Figure 2:
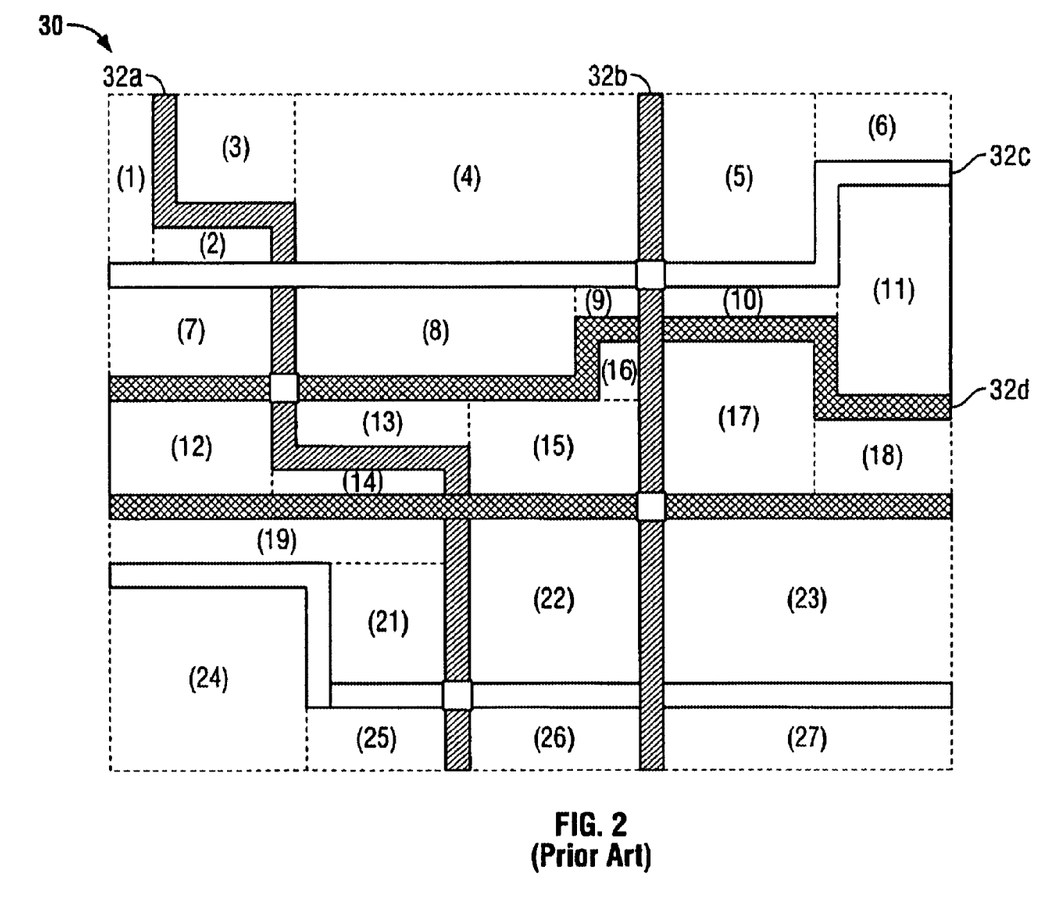
FIG. 2 is a diagram schematically illustrating an example of an IC design area including design figures as represented inside an Opus database and white spaces.

FIG. 2 schematically illustrates an example of an IC design area 30 including design FIGS. 32 (32a, 32b, ...) as represented inside the Opus database and white spaces (rectangular areas) (1)–(27). The design figures are shown as metal wires and vias in this example. The white spaces (1)–(27) are detected based on those design figures. The white space detection may be done using any conventional IC design tool or method compatible to the Opus database.

Figure 3:
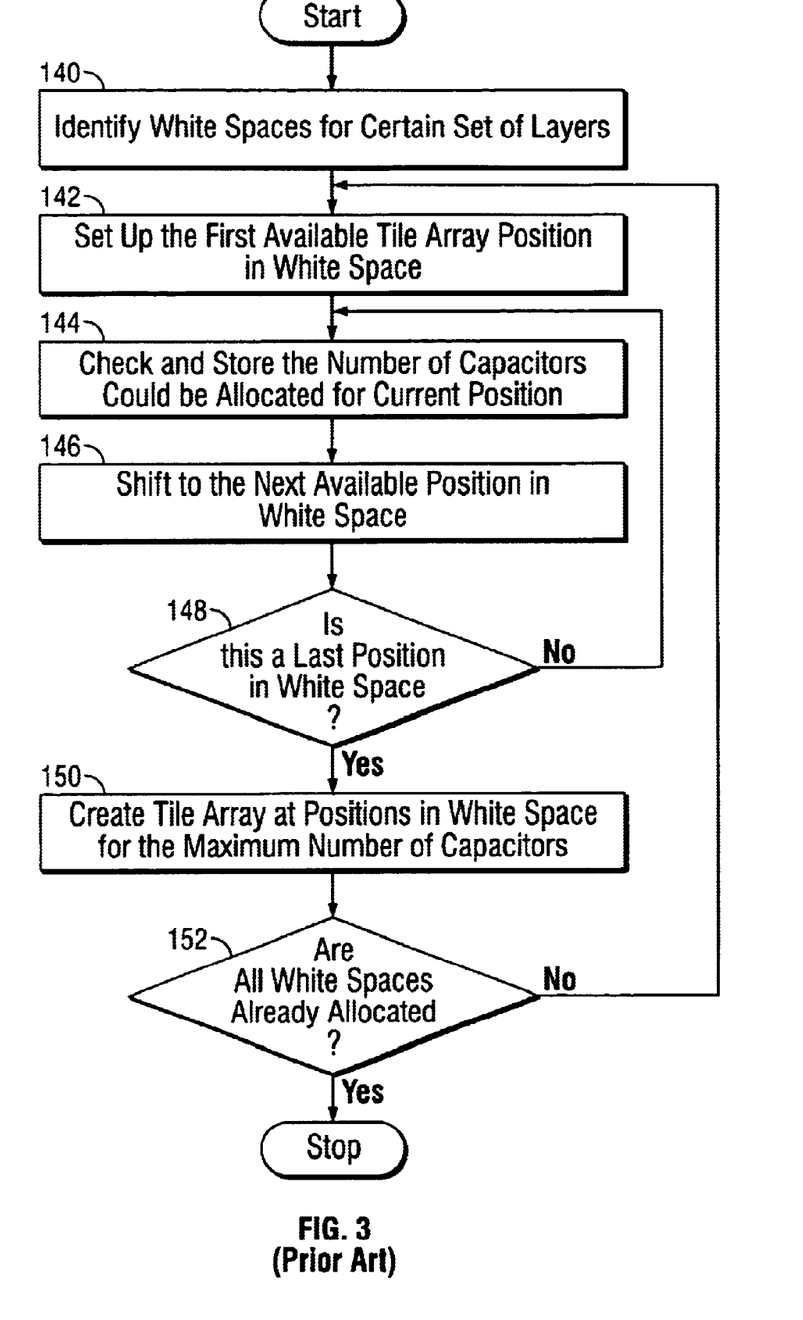
FIG. 3 is a process flow diagram schematically illustrating a decoupling capacitor allocation using a conventional method.
Figure 4:
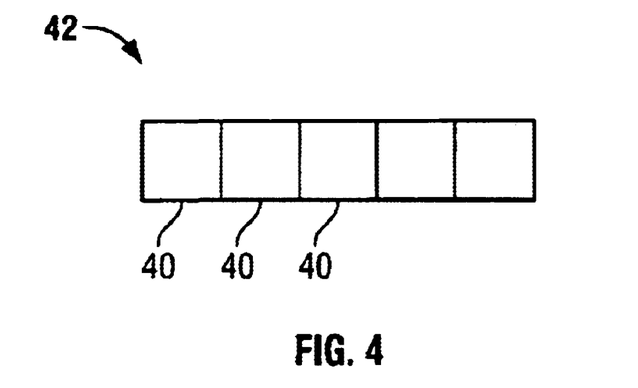
FIG. 4 is a diagram schematically illustrating an example of a capacitor cell array.

For comparison, a conventional method for allocating decoupling capacitors is explained referring to FIG. 3. First, the white spaces with respect to a set of layers are identified (140), as described above. Each white space is an available position for decoupling capacitors. A capacitor cell (special purpose cell) may be defined for a decoupling capacitor so that the decoupling capacitor allocation is performed as capacitor call allocation. FIG. 4 schematically illustrates an example of a capacitor cell array 42, which includes a set of capacitor cells 40 arranged in a certain direction (typically along a coordinate axis). The capacitor cell array 42 is also referred to as a "tile array" in the context of capacitor cell allocation. The decoupling capacitor allocation may be solved as capacitor cell array (tile array) allocation in the white spaces. A tile array may have any number of capacitor cells in accordance with the size of white spaces and their distribution in the IC design area.

Referring back to FIG. 3, a first available position for the capacitor cell array(s), for example, in a first white space (1), is selected (142). The number of capacitor cells that can be allocated to that position (i.e., the length of a capacitor cell array) within that white space is checked and stored (144). Then the cell array allocation is shifted to a next available position (or possible position) (146). This allocation process is repeated for all available positions in the white space (148). After checking all available positions and the number of capacitor cells thereon and storing the information, the white space is (virtually) filled with the capacitor cell arrays such that the total number of the decoupling capacitor cells in that white space is maximized under certain constraints (150). The procedures through 142 to 150 are repeated until all available positions are examined for each white space, and all white spaces are allocated with capacitor cell arrays.

The goal of the capacitor cell allocation is to place as much decoupling capacitor cells as possible so as to fill all white spaces under certain constraints. For example, such problem may be formulated using a formal definition in Dynamic Programming as follows (here, "programming" referred to a tabular method, and not to writing computer code):

$$\text{Maximize } N = \sum_i n_i \quad (1)$$

$$\text{Subject to } n_i \notin \text{AREA} \quad (2)$$

$$\text{min Overlap} \leq n_i \cap n_j \leq \text{max Overlap} \quad (3)$$

$$\text{dist}(n_i, n_j) \leq \text{min Spacing} \quad (4)$$

where N denotes the total number of decoupling capacitor cells allocated, $n_i$ denotes a single decoupling capacitor cell, and AREA denotes an on-chip space already allocated (such as a metal figure). The constraint (3) represents a placing rule for the intersection between two decoupling capacitor cells in a specific direction, and the constraint (4) represents a placing rule for the minimum allowable distance between two decoupling capacitor cells in a specific direction.

The complexity of the above-described approach is the order of K×M×L, where K denotes the number of tile arrays finally allocated, M denotes the number of tile array positions available under the constraints, and L denotes the number of white spaces. As the size and design density of an IC design (on a chip) increases, these numbers increases so rapidly that the capacitor cell allocation becomes too time-consuming, and optimum cell array allocation may become difficult to achieve within a feasible time period for a specific design schedule.

Figure 5:
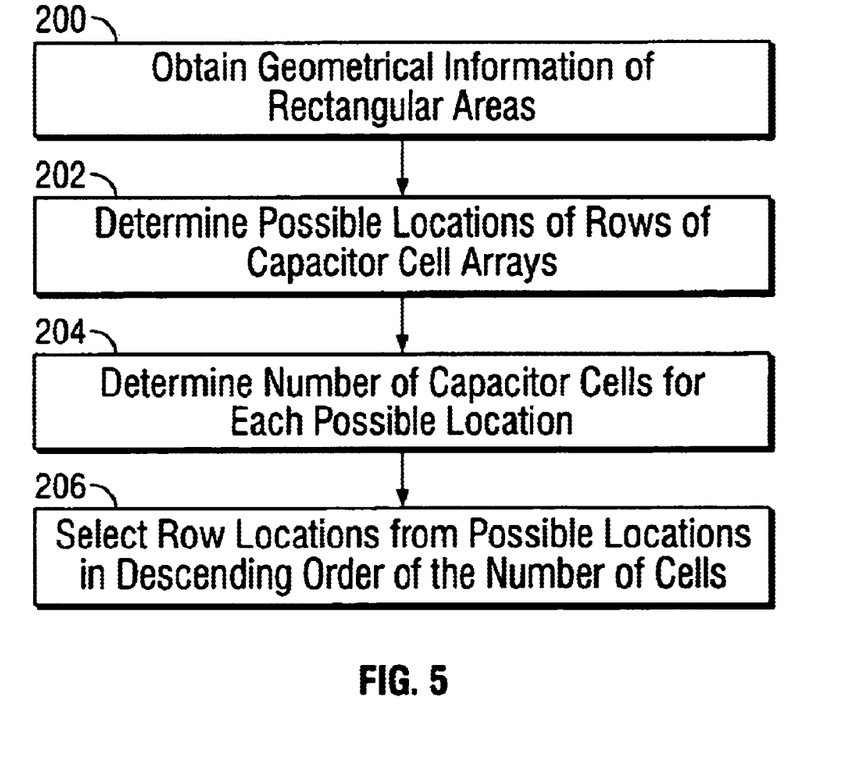
FIG. 5 is a process flow diagram schematically illustrating a method for allocating decoupling capacitor cells in an IC design in accordance with one embodiment of the present invention.

FIG. 5 schematically illustrates a method for allocating decoupling capacitor cells in an IC design in accordance with one embodiment of the present invention. First, geometrical information of rectangular areas (white spaces) in the IC design is obtained (200). Each of the rectangular area is a white space that does not intersect any design figure in selected metal layers of the IC design in a design area. The geometrical information typically includes coordinates in the design area of the IC design, and may be obtained from data objects for design figures contained in a database (such as an Opus database) using an IC design tool, as described above.

Then, possible locations for rows of decoupling capacitor cell arrays are determined (202). As described above, the decoupling capacitors are represented by tile arrays of special purpose cells (capacitor cell arrays). Typically, a capacitor cell array includes one decoupling capacitor per cell in the direction of a first coordinate axis of the design area (for example, X-direction). A row includes a set of capacitor cell arrays to be placed across the rectangular areas in the direction of the first coordinate axis. In determining the possible locations, constraints required by a design rule need not be considered. After all possible row locations in the design area are determined, the number of decoupling capacitor cells included in each row is determined for all possible locations (204). Then, row locations that satisfy a certain design rule are selected from among the possible locations in a descending order of the number of the decoupling capacitor cells (206). This maximizes the number of capacitor cells allocated in the rectangular areas.

Figure 6:
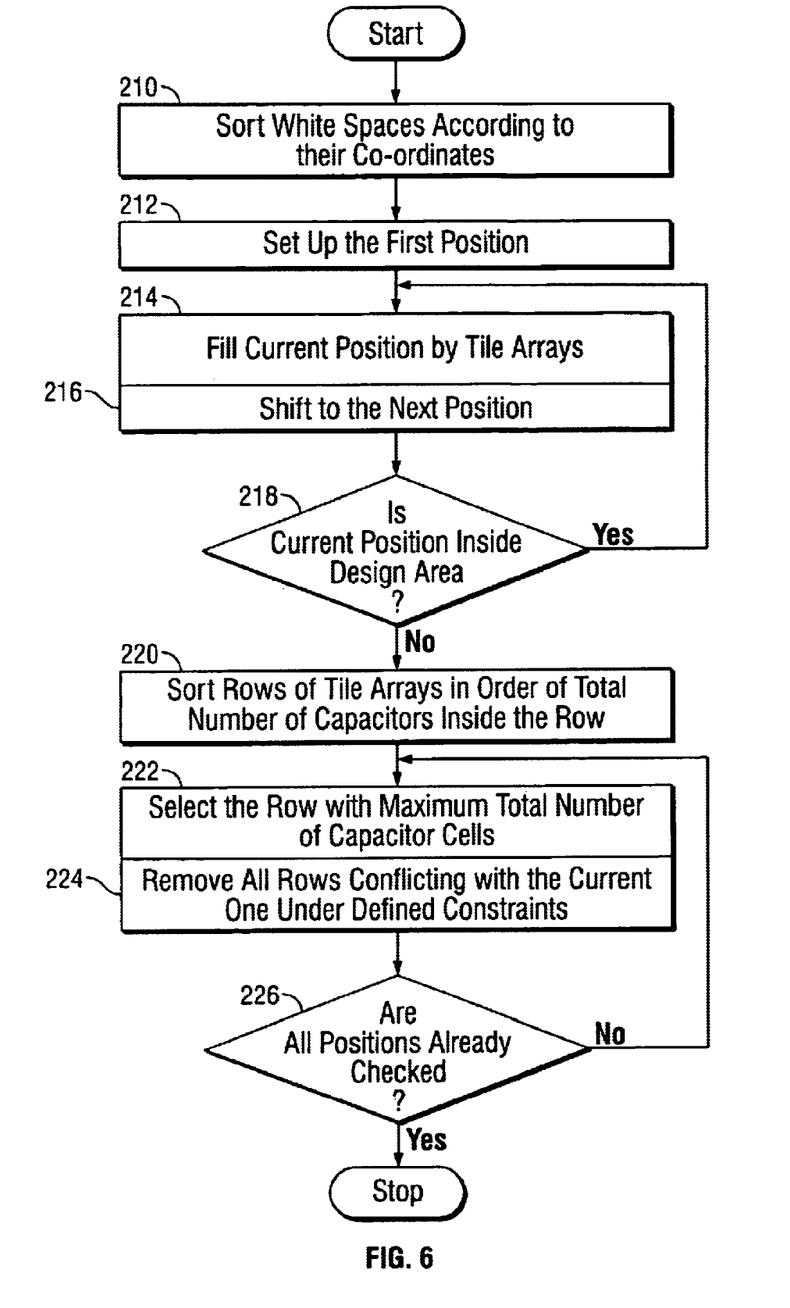
FIG. 6 is a process flow diagram schematically illustrating a method for allocating decoupling capacitor cells in accordance with one embodiment of the present invention.

FIG. 6 schematically illustrates a method for allocating decoupling capacitor cells in accordance with one embodiment of the present invention, where the determination of the possible row locations includes sorting the rectangular areas. As shown in FIG. 6, the rectangular areas (white spaces) are sorted in accordance with their coordinates (210).

Figure 7:
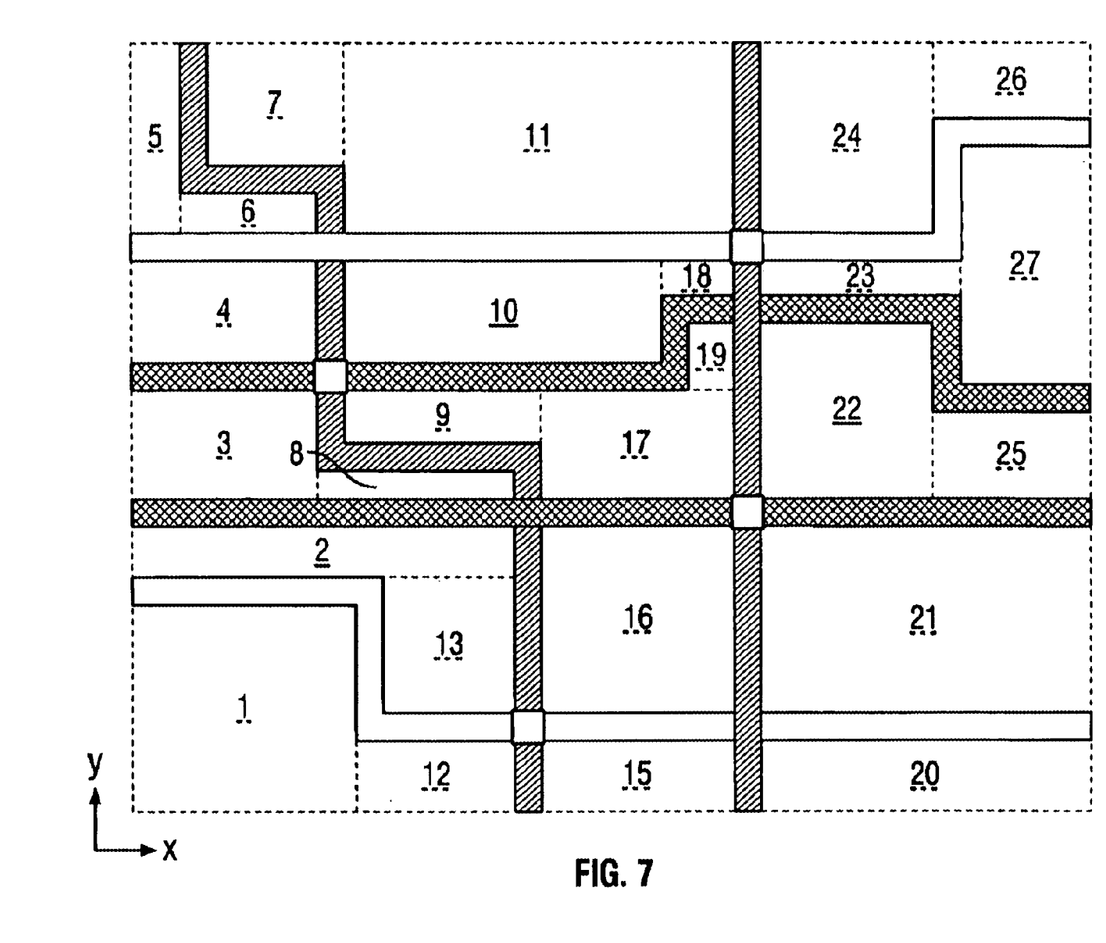
FIG. 7 is a diagram schematically illustrating an example of the result of sorting the rectangular areas in accordance with one embodiment of the present invention.

For example, the rectangular areas are first sorted in accordance with the first coordinate (X), and then in accordance with the second coordinate (Y). FIG. 7 schematically illustrates an example of the result of the sorting. In FIG. 7, the sorted rectangular areas are numbered in the order of their lowest X-coordinates, and among the rectangular areas having the same X-coordinate, in the order of their lowest Y-coordinates, provided the origin of the coordinates are at the left bottom of the design area. However, the numbering of the rectangular areas and the coordinate system are not limited to this example. Any coordinate system and a predetermined coordinate position may be used to identify and sort the rectangular areas with respect to their location in the design area.

Referring back to FIG. 6, after sorting the rectangular areas, a starting position for allocation is selected in a first rectangular area sorted in accordance with the first coordinate (212). For example, the starting position may be the origin of the coordinates, if it is within the first rectangular area. If a metal layer is placed on the origin, a coordinate position closest to the origin may be selected as the starting position for the first possible row. However, it is not limited to the origin, but any predetermined coordinate position may be used to define the starting position for the first possible row in the design area, depending on the coordinate system employed for the design area.

Figure 8:
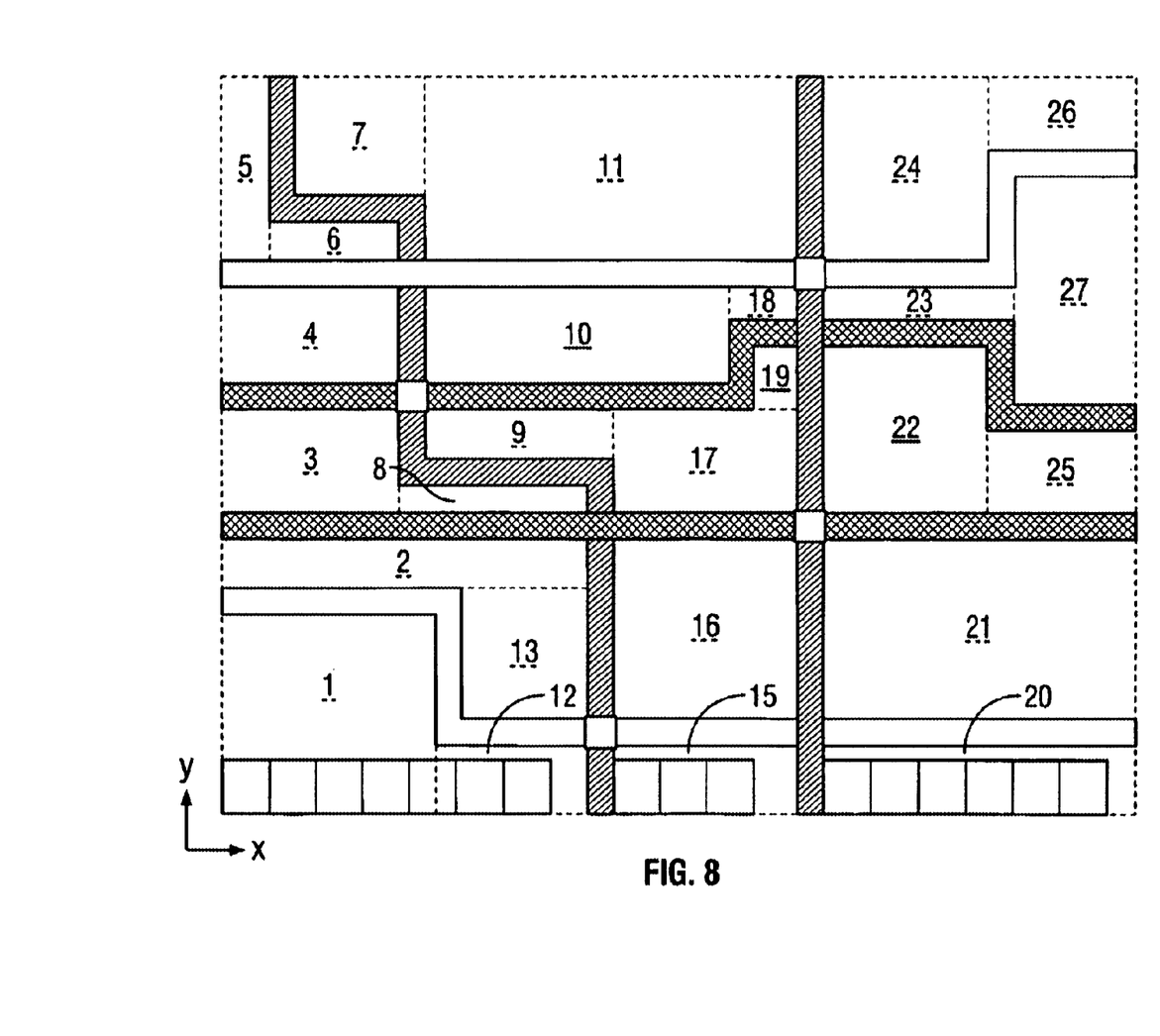
FIG. 8 is a diagram schematically illustrating a first possible row of capacitor cell arrays placed in the IC design area in accordance with one embodiment of the present invention.

Then, starting with the starting position, the capacitor cell arrays are virtually placed at the same Y-coordinate across the rectangular areas (214). For example, as shown in FIG. 8, the capacitor cell arrays are virtually placed across the rectangular areas 1, 12, 15, and 20 in the direction of the X-coordinate axis. These particular rectangular areas along the X-coordinate axis have been obtained by sorting the white spaces according to their Y-coordinates. Referring back to FIG. 6, after virtually placing capacitor cell arrays on the first possible row, the starting position is shifted to a second position (216), for example, by changing the Y-coordinate a predetermined amount. Depending on the location and distribution of the rectangular areas, the shifting may also involve changing the X-coordinate of the starting position. Then, next capacitor cell arrays are virtually placed on the second possible row starting from the second position. The capacitor cell arrays are "virtually" placed because they are not formed on an actual IC chip. The shifting and virtual-placing are iteratively repeated until all rectangular areas in the design are are filled with the capacitor cell arrays (218).

Figure 9:
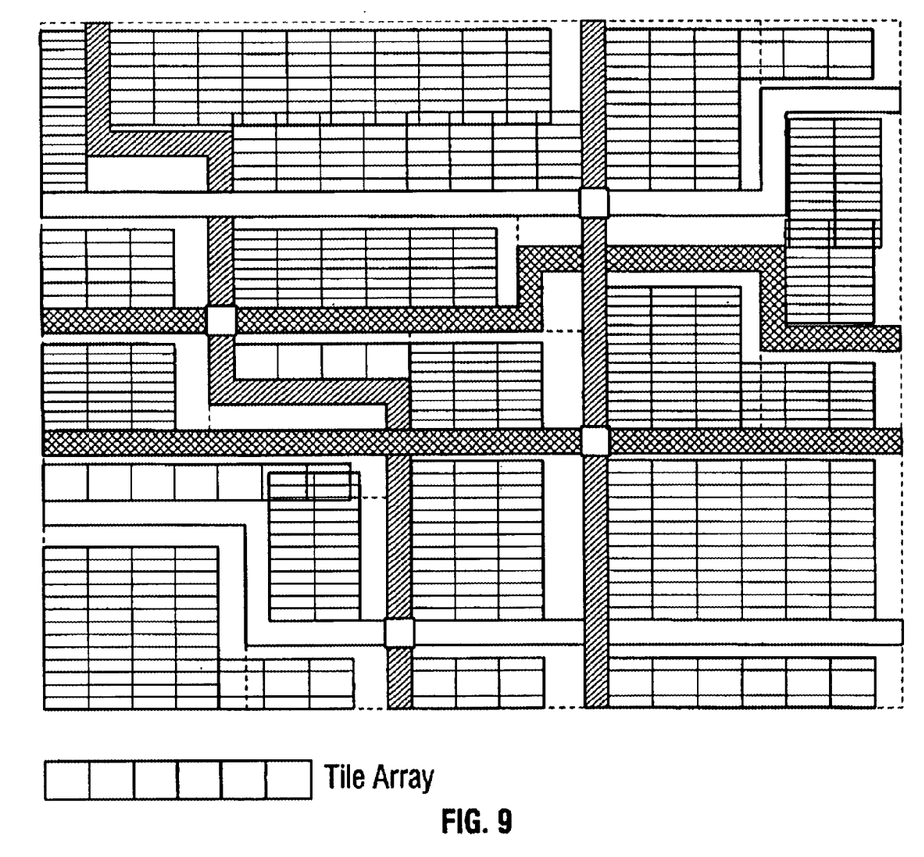
FIG. 9 is a diagram schematically illustrating the rectangular areas filled with virtual cell arrays placed on all possible row locations in accordance with one embodiment of the present invention.

FIG. 9 schematically illustrates the rectangular areas filled with the virtual capacitor cell arrays placed on all possible row locations (with a selected shift amount). As shown in FIG. 9, the cell arrays are virtually placed row by row, rather than are by area, and overlap each other in the Y-direction.

It should be noted that a capacitor cell array is typically placed a certain distance from a closest metal figure under a design rule, as described above. This constraint may be taken into account by the white space detection procedure before allocating the capacitor cell arrays. For example, the available rectangular areas may be provided so that they have the certain distance from the metal figures. As shown in FIG. 9, individual cells of capacitor cell arrays on adjacent possible rows need not be aligned in some situations. That is, the capacitor cell arrays may be shifted by any distance in the direction of the X-coordinate axis when they are virtually placed on a possible row.

Figure 10:
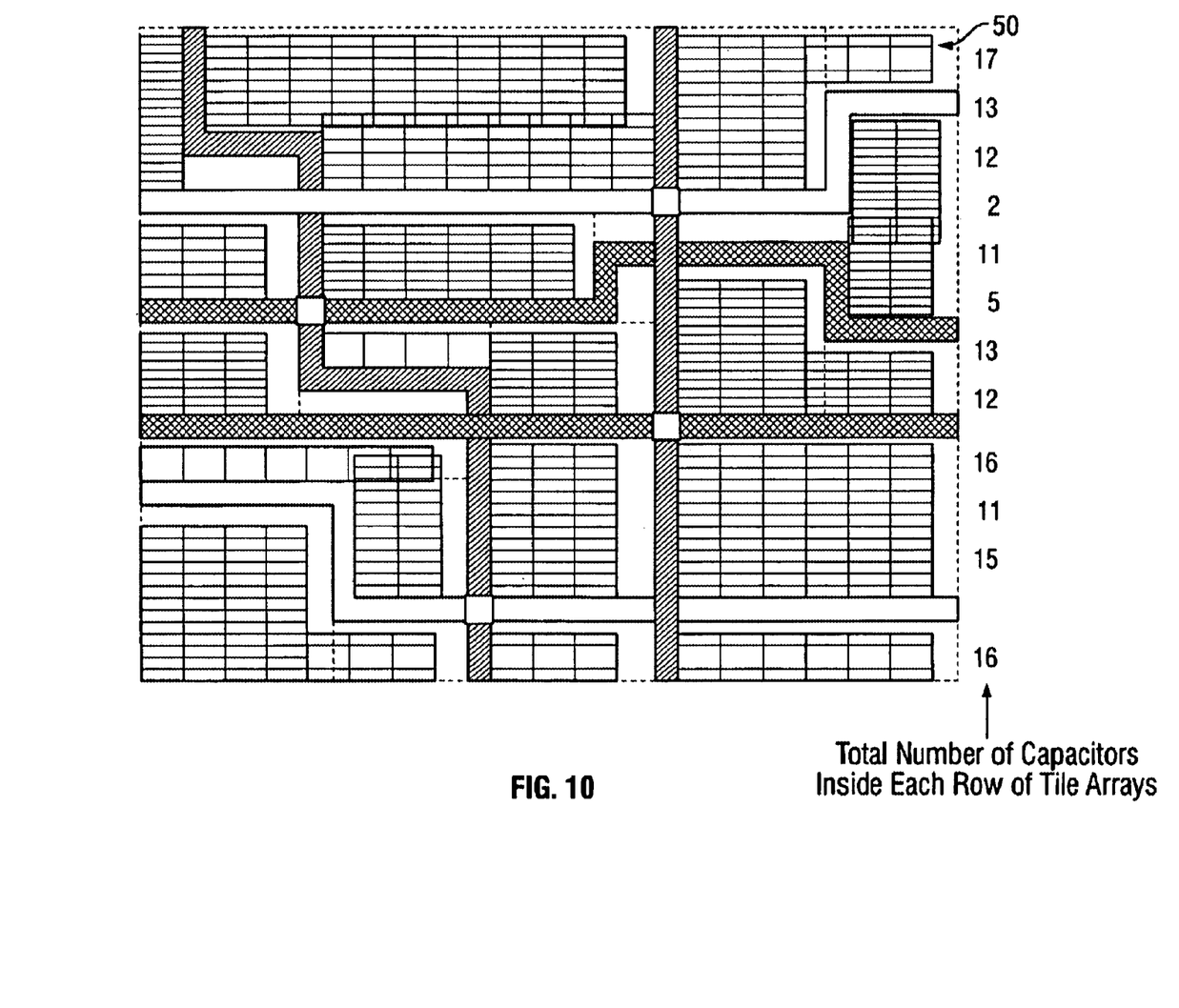
FIG. 10 is a diagram schematically illustrating an example of a result of sorting rows in accordance with the number of capacitor cells according to one embodiment of the present invention.

In accordance with one embodiment of the present invention, as shown in FIG. 6, selecting row locations includes sorting the possible row locations in accordance with the number of the decoupling capacitor cells included in each row (220). FIG. 10 schematically illustrates an example of a result of the sorting. The total number of capacitor cells in each possible row is also indicated on the right. After sorting the possible rows, referring back to FIG. 9, a row location having a largest number of the decoupling capacitor cells is selected (222), and all possible row locations conflicting with the selected row location are removed (224). The conflicting locations may be removed by eliminating the possible locations within a certain distance from the selected row location, or within a predetermined pitch required by the design rule or cell-placement rule. The conflicting locations may also removed by determining if the cell arrays on the possible location overlap with cell arrays on the selected row location more than a predetermined amount. The design/placement rule may differ depending on the type of decoupling capacitor cell.

A second row location having a largest number of the decoupling capacitor cells is then selected from among the remaining possible locations (i.e., possible locations not conflicting with the selected row location), and then, the possible row locations conflicting with the second row location are removed. This selecting a second row location and removing conflicting row locations are iteratively repeated until all possible locations are either selected or removed (226).

Figure 11:
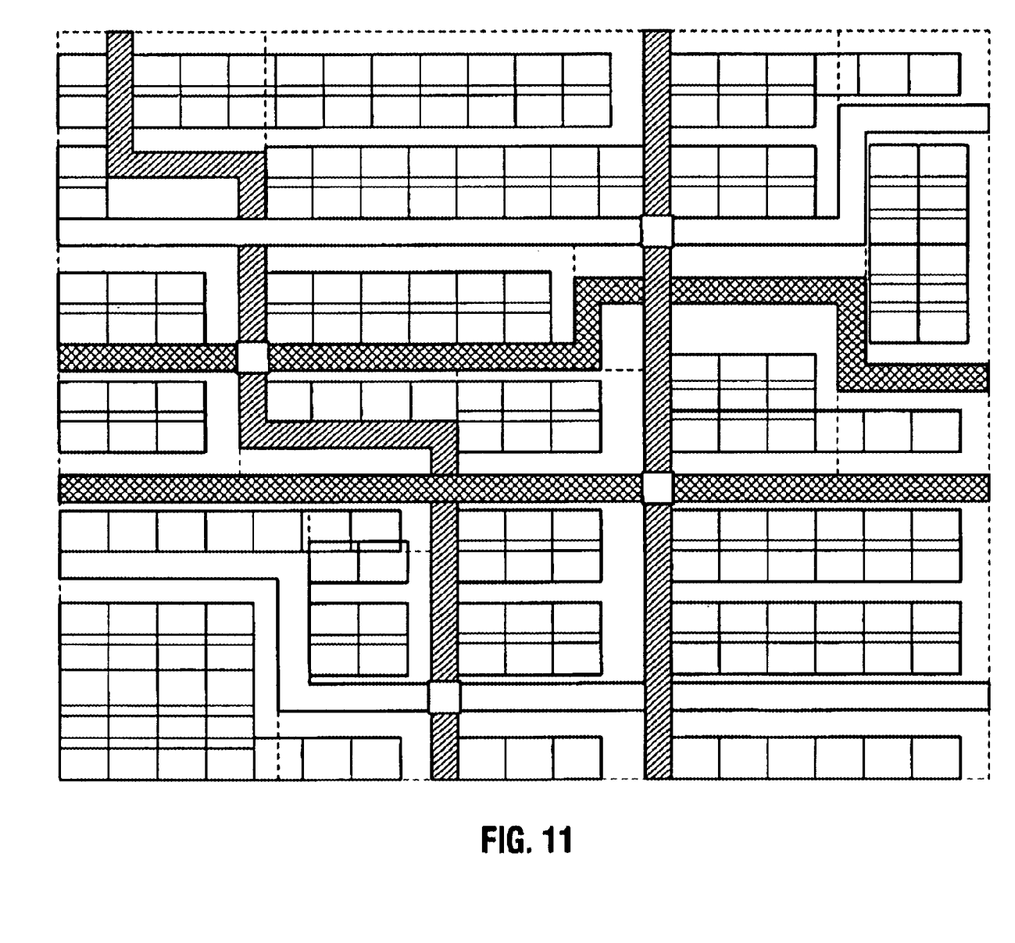
FIG. 11 is a diagram schematically illustrating an example of the final cell array placement after applying the selection and removal of possible rows in accordance with one embodiment of the present invention.

In the example shown in FIG. 10, the top two possible rows 50 contain the same maximum number (17) of capacitor cells. Thus, one of them is selected first, and the other is removed because it overlaps the selected row more then a defined amount. Other possible rows conflicting with the selected one are also removed. When a plurality of possible rows have the same number of capacitor cells, they may be selected in accordance with a certain placement rule, for example, in the order of lower Y-coordinate value. The next largest number of capacitor cells is sixteen (16), and the next row position is selected in the same manner. In addition, in selecting an adjacent row position, a minimum amount of overlap may also be imposed as a constraint. FIG. 11 schematically illustrates an example of the final capacitor cell array placement after applying the selection and removal of possible rows as described above.

The complexity of the method in accordance with one embodiment of the present invention is close to the order of M×log(L), while keeping all other features the same. This is because fast sorting algorithm with almost linear complexity is used in determining row positions according to the number of capacitor cells in each tow position. The present approach allows handling full chip data with millions of objects for a short time period, for example, 5–10 minutes. In addition, the memory usage can be reduced while keeping high performance by using the Opus database and its connectivity properties, which provide fast access to the data of decoupling capacitor cell array inside the row.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for allocating decoupling capacitor cells in an integrated circuit (IC) design, said method comprising:
    obtaining geometrical information of rectangular areas in the IC design, each of the rectangular areas not intersecting any design figure in selected metal layers of the IC design in a design area;
    determining possible locations for rows of decoupling capacitor cell arrays to be placed in the rectangular areas, a row including a set of cell arrays to be placed across the rectangular areas in a direction of a first coordinate axis of the design area;
    determining for each possible location a number of decoupling capacitor cells included in the row; and
    selecting row locations satisfying a certain design rule from among the possible locations in a descending order of the number of the decoupling capacitor cells.

2. A method in accordance with claim 1 wherein said determining possible locations includes:
    providing a certain distance between the cell arrays to be placed in the rectangular area and a closest metal-layer figure.

3. A method in accordance with claim 1 wherein said determining possible locations is performed starting with a first rectangular area closest to a predetermined position in the IC design.

4. A method in accordance with claim 3 wherein the predetermined position is the origin of the coordinates.

5. A method in accordance with claim 1 wherein the geometrical information of the rectangular areas is obtained from data objects for design figures contained in a database.

6. A method in accordance with claim 1 wherein the certain design rule includes a maximum amount of overlapping between adjacent rows.

7. A method in accordance with claim 1 wherein the certain design rule includes a placing rule specifying a maximum amount and a minimum amount of overlapping between two cell arrays in a direction of a second coordinate axis.

8. A method in accordance with claim 1 wherein the geometrical information includes coordinates in a design area of the IC design.

9. A method in accordance with claim 8, further comprising:
    sorting the rectangular areas in accordance with the coordinates.

10. A method in accordance with claim 9, further comprising:
    determining a first rectangular area by sorting the rectangular areas in accordance with the first coordinate, said determining possible locations being performed starting with the first rectangular area.

11. A method in accordance with claim 9 wherein each row includes a set of cell arrays to be placed across the rectangular areas sorted in accordance with a second coordinate.

12. A method in accordance with claim 9 wherein each row includes a set of cell arrays to be placed at a same second coordinate.

13. A method in accordance with claim 8 wherein said determining possible locations includes:
 selecting a starting position in a first rectangular area sorted in accordance with the first coordinate;
 virtually placing the cell arrays, starting with the starting position, at a same second coordinate across the rectangular areas; and
 shifting the stating position to a second position.

14. A method in accordance with claim 13 wherein said determining possible locations further includes:
 iteratively repeating said shifting and said virtually placing until all rectangular areas are filled with the virtually placed cell arrays.

15. A method in accordance with claim 14 wherein said shifting includes:
 changing the second coordinate of the starting position a predetermined amount.

16. A method in accordance with claim 14 wherein said shifting includes:
 changing the first coordinate of the starting position a selected amount.

17. A method in accordance with claim 1 wherein said selecting row locations includes:
 sorting the possible locations in accordance with the number of the decoupling capacitor cells.

18. A method in accordance with claim 17 wherein said selecting row locations further includes:
 selecting a first row location having a largest number of the decoupling capacitor cells;
 removing possible locations conflicting with the selected row location;
 selecting a second row location having a largest number of the decoupling capacitor cells from among the possible locations not conflicting with the selected row location; and
 iteratively repeating said removing and said selecting a second row location until all possible locations are either selected or removed.

19. A method in accordance with claim 18 wherein said selecting row locations further includes:
 determining conflicting locations with respect to the selected row location.

20. A method in accordance with claim 19 wherein said determining conflicting locations includes:
 determining locations within a certain distance from the selected row location.

21. A method in accordance with claim 19 wherein said determining conflicting locations includes:
 determining locations which cell arrays to be overlapping with cell arrays on the selected row location more than a predetermined amount.

22. An apparatus for allocating decoupling capacitor cells in an integrated circuit (IC) design, said apparatus comprising:
 means for obtaining geometrical information of rectangular areas in the IC design, each of the rectangular areas not intersecting any design figure in selected metal layers of the IC design in a design area;
 means for determining possible locations for rows of decoupling capacitor cell arrays to be placed in the rectangular areas, a row including a set of cell arrays to be placed across the rectangular areas in a direction of a first coordinate axis of the design area;
 means for determining for each possible location a number of decoupling capacitor cells included in the row; and
 means for selecting row locations satisfying a certain design rule from among the possible locations in a descending order of the number of the decoupling capacitor cells.

23. An apparatus in accordance with claim 22 wherein said means for determining possible locations includes:
 means for providing a certain distance between the cell arrays to be placed in the rectangular area and a closest metal-layer figure.

24. An apparatus in accordance with claim 22 wherein said means for determining possible locations performs determination starting with a first rectangular area closest to a predetermined position in the IC design.

25. An apparatus in accordance with claim 24 wherein the predetermined position is the origin of the coordinates.

26. An apparatus in accordance with claim 22 wherein said means for obtaining obtains the geometrical information of the rectangular areas from data objects for design figures contained in a database.

27. An apparatus in accordance with claim 22 wherein the certain design rule includes a maximum amount of overlapping between adjacent rows.

28. An apparatus in accordance with claim 22 wherein the certain design rule includes a placing rule specifying a maximum amount and a minimum amount of overlapping between two cell arrays in a direction of a second coordinate axis.

29. An apparatus in accordance with claim 22 wherein the geometrical information includes coordinates in a design area of the IC design.

30. An apparatus in accordance with claim 29, further comprising:
 means for sorting the rectangular areas in accordance with the coordinates.

31. An apparatus in accordance with claim 30, further comprising:
 means for determining a first rectangular area by sorting the rectangular areas in accordance with the first coordinate, said determining possible locations being performed starting with the first rectangular area.

32. An apparatus in accordance with claim 30 wherein each row includes a set of cell arrays to be placed across the rectangular areas sorted in accordance with a second coordinate.

33. An apparatus in accordance with claim 30 wherein each row includes a set of cell arrays to be placed at a same second coordinate.

34. An apparatus in accordance with claim 29 wherein said means for determining possible locations includes:
 means for selecting a starting position in a first rectangular area sorted in accordance with the first coordinate;
 means for virtually placing the cell arrays, starting with the starting position, at a same second coordinate across the rectangular areas; and
 means for shifting the stating position to a second position.

35. An apparatus in accordance with claim 34 wherein said means for determining possible locations further includes:
 means for iteratively repeating said shifting and said virtually placing until all rectangular areas are filled with the virtually placed cell arrays.

36. An apparatus in accordance with claim 35 wherein said means for shifting includes:
 means for changing the second coordinate of the starting position so as to provide a certain pitch between adjacent possible locations.

37. An apparatus in accordance with claim 35 wherein said means for shifting includes:
   means for changing the first coordinate of the starting position a selected amount.

38. An apparatus in accordance with claim 22 wherein said means for selecting row locations includes:
   means for sorting the possible locations in accordance with the number of the decoupling capacitor cells.

39. An apparatus in accordance with claim 38 wherein said means for selecting row locations further includes:
   means for selecting a first row location having a largest number of the decoupling capacitor cells;
   means for removing possible locations conflicting with the selected row location;
   means for selecting a second row location having a largest number of the decoupling capacitor cells from among the remaining possible locations; and
   means for iteratively repeating said removing and said selecting a second row location until all possible locations are either selected or removed.

40. An apparatus in accordance with claim 39 wherein said means for selecting row locations further includes:
   means for determining conflicting locations with respect to the selected row location.

41. An apparatus in accordance with claim 40 wherein said means for determining conflicting locations includes:
   means for determining locations within a certain distance from the selected row location.

42. An apparatus in accordance with claim 40 wherein said means for determining conflicting locations includes:
   means for determining locations which cell arrays to be overlapping with cell arrays on the selected row location more than a predetermined amount.

43. A program storage device readable by a machine, tangibly embodying a program of instructions executable by the machine to perform a method for allocating decoupling capacitor cells in an integrated circuit (IC) design, said method comprising:
   obtaining geometrical information of rectangular areas in the IC design, each of the rectangular areas not intersecting any design figure in a metal layer of the IC design in a design area;
   determining possible locations for rows of decoupling capacitor cell arrays to be placed in the rectangular areas, a row including a set of cell arrays to be placed across the rectangular areas in a direction of a first coordinate axis of the design area;
   determining for each possible location a number of decoupling capacitor cells included in the row; and
   selecting row locations satisfying a certain design rule from among the possible locations in a descending order of the number of the decoupling capacitor cells.

* * * * *